United States Patent [19]

Yamazaki

[11] 4,051,442
[45] Sept. 27, 1977

[54] GAIN CONTROL CIRCUITS FOR AUDIO AMPLIFIERS

[75] Inventor: Seishi Yamazaki, Mito, Japan

[73] Assignee: Hitachi, Ltd., Japan

[21] Appl. No.: 675,239

[22] Filed: Apr. 8, 1976

[30] Foreign Application Priority Data

Apr. 11, 1975 Japan .............................. 50-48205[U]

[51] Int. Cl.$^2$ .............................................. H03G 3/30
[52] U.S. Cl. .................................... 330/281; 330/278
[58] Field of Search ................. 325/410; 330/29, 129, 330/136, 138, 141

[56] References Cited

U.S. PATENT DOCUMENTS

| | | | |
|---|---|---|---|
| 2,556,070 | 6/1951 | DeGroot et al. | 325/410 X |
| 3,230,458 | 1/1966 | Stangeland | 325/410 |
| 3,790,896 | 2/1974 | Shimizu et al. | 330/141 X |
| 3,848,194 | 11/1974 | Nishimura et al. | 330/29 |

*Primary Examiner*—Lawrence J. Dahl
*Attorney, Agent, or Firm*—Craig & Antonelli

[57] ABSTRACT

A gain control circuit is connected between an output terminal of a transistor detector circuit for audio-frequency or voice signal and an audio amplifier circuit. The gain control circuit comprises a control transistor having an output electrode at which an output potential is produced which is lowered correspondingly as the potential at the output electrode of the detection transistor is decreased, and is utilized for controlling the gain of the audio amplifier circuit. The gain control circuit further comprises time constant circuit, for controlling the control time and the restoring time of the potentials at the output electrodes of the above two transistors and a switching circuit.

18 Claims, 5 Drawing Figures

GAIN CONTROL CIRCUITS FOR AUDIO AMPLIFIERS

BACKGROUND OF THE INVENTION

1. Field of the Invention

The present invention relates to a gain control circuit which can be suitably used in single side-band receiver, tape recorder or the like apparatus. More particularly, the invention relates to a gain control circuit for audio or voice frequency amplifier circuits or apparatus.

2. Description of the Prior Art

In the gain control circuit for the audio frequency amplifier circuit destined to amplify the audio or voice signal which has usually varying signal levels in a large range of magnitude, it is generally accepted that the gain control element of the control circuit should preferably have a short control time, while the restoring time of the control element is to be long. In this connection, the term "control time or duration" or "control operation or duration" as herein used means the time interval which is required for starting the operation of the gain control circuit from response to an audio input signal thereto. Further, the term "restoring time or duration" or "restoration time or duration" means the time span which elapses until the gain control potential has resumed the original or starting level, as measured from the time point at which the input signal disappeared. When the control time is short, the gain control circuit can rapidly respond to the input signal, whereby the input signal can be advantageously controlled without distortion. On the other hand, the restoring time of a long duration provides such advantage that the input signal having a relatively high signal level which follows the disappearance of a preceding input signal of the substantially same signal level may undergo an adequate gain control operation.

The hitherto known gain control circuit of the above described type has certainly a short control time. However, the restoring time of the conventional gain control circuit is disadvantageously varied in dependence on the magnitude of the input signal level. In other words, when the level of the input signal is low, the restoring time becomes short and vice versa regardless of the input duration, i.e. whether the input signal is of a single shot variety or continuous type. Thus, the restoring time becomes longer for the high level input signal, even when the input signal is of the single shot kind such as a spike pulse. This feature of the hitherto known gain control circuit brings about certain disadvantages. For example, assuming that a low level audio signal is supplied to the gain control circuit after the application of an audio-frequency signal of the one shot nature having a relatively high signal level, then the succeeding low level signal will be attenuated, because the gain of the input amplifier circuit is rapidly lowered by the preceding high level signal.

Due to the above described characteristic, the hitherto known gain control circuit will provide serious disadvantage in certain applications thereof. For example, it is assumed that the conventional gain control circuit is employed in a transmitter-receiver apparatus. As is well known, a switching noise signal of a relatively high level will be produced, when such apparatus is switched into the receiver mode from the transmitter mode. The gain control circuit will then operate in response to the input noise signal with the aforementioned characteristic of the control and the restoring time durations. In such situation, a leading portion of the audio or speech signal received by the apparatus operating now in the receiver mode may be undesirably attenuated or cut off, since the gain of the input amplifier circuit destined to amplify the input signal would be still in a controlled level which has been involved by the preceding switching noise due to the long restoring time of the gain control circuit.

SUMMARY OF THE INVENTION

Accordingly, an object of the present invention is to provide an improved gain control circuit which exhibits a rapid restoration from the gain control operation for the input signal having a short input duration on one hand and provides on the other hand a long or delayed restoration from the gain control operation for the input signal having a long input duration.

Another object of the invention is to provide a gain control circuit which can generate appropriate time duration for the gain control operation as well as the restoration therefrom in dependence on the level and input duration of the input signal.

Still another object of the invention is to provide a gain control circuit which can selectively set the time duration for the gain control operation as well as for the restoration therefrom with a great facility.

Further object of the invention is to provide a gain control circuit which permits the gain control output potential to be freely selectively adjusted.

Still further object of the invention is to provide a gain control circuit of a simplified circuit arrangment.

Will the above objects in view, there is provided according to the invention a gain control circuit which comprises a detector circuit for deriving a fraction of an audio signal from an associated channel and detecting the derived signal, time constant circuits for controlling the duration of variation in the potential at output electrode or terminal of the detector circuit in dependence on the magnitude of the input audio signal and the length of the input duration time, and a switching circuit, wherein the potential at the output terminal of the detector circuit is applied to the input terminal of a gain control element of a gain control circuit thereby to control the potential at the output terminal or electrode of the gain control element as a function of variation in the potential at the output terminal of the detector circuit to ultimately control the gain of an audio or voice frequency amplifier circuit by the controlled output voltage produced from the gain control element.

According to a feature of the invention, when the input duration of the audio input signal is short, the restoring time from the gain control operation can be made short, even if the audio input signal has a high signal level. Thus, another input signal succeeding to the above signal will not be cancelled or attenuated, even if the succeeding signal is of a low signal level. In this way, the aforementioned disadvantage of the hitherto known gain control circuit can be eliminated.

In the case of the gain control circuit according to the invention, the time duration of the gain control operation as well as the time required for the restoration therefrom is controlled in dependence on the level of the audio input signal and the input duration thereof, whereby an optimum gain control can be attained.

Furthermore, the output potential of the gain control circuit, the time duration of the control operation thereof and the restoring time can be substantially arbitrarily selected according to the teaching of the invention.

Additionally, the gain control circuit according to the invention can be constructed in a simplified circuit configuration.

DESCRIPTION OF THE PREFERRED EMBODIMENTS

Now, the invention will be described in more detail by referring to the accompanying drawings.

Figure 1:
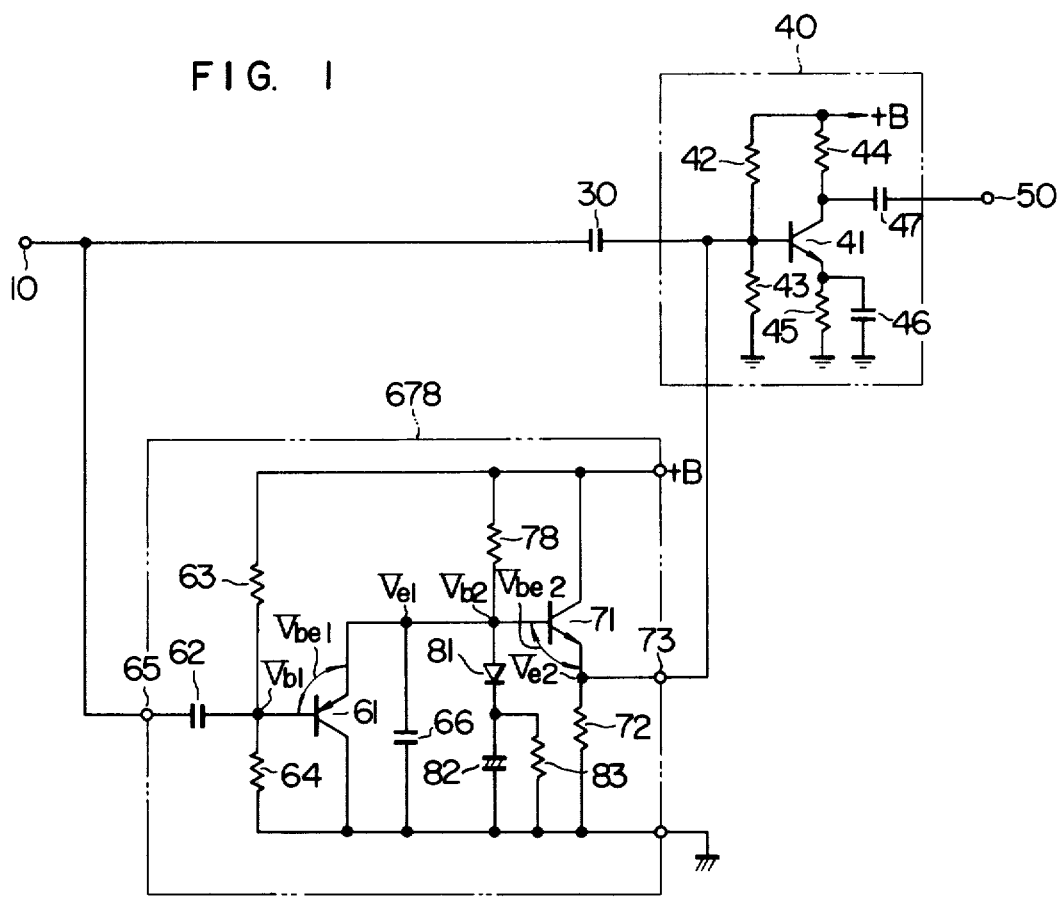
FIG. 1 is a circuit diagram showing an exemplary embodiment of the gain control circuit according to the invention.

FIG. 1 is a circuit diagram showing a gain control circuit according to the invention. In the figure, reference numeral 61 denotes a PNP-type transistor having a base connected to a power source +B through a resistor 63 and at the same time grounded by way of a resistor 64. The base of the transistor is additionally connected to an input terminal 65 of the gain control circuit indicated generally by numeral 678 through a capacitor 62, the input terminal 65 in turn being connected to an audio or voice signal input terminal 10. The collector of the transistor 61 is directly grounded, while the emitter thereof is indirectly grounded through a smoothing capacitor 66 of a small capacity such as of 3.3 μF, for example. The emitter of the transistor 61 is also connected to the base of a NPN-type transistor 71, which base is connected to the power source +B through a resistor 78. The base of the transistor 71 is also grounded through a switching diode 81 and through a parallel connection of a capacitor 82 of a large capacity such as of 47 μF, for example, and a resistor 83 of a large value such as of 47 k Ω, for example. The collector of the transistor 71 is directly connected to the power supply +B, while the emitter thereof is grounded through a load resistor 72 and additionally connected to an output terminal 73 of the gain control circuit 678. The output terminal 73 of the circuit 678 is connected to the base of an audio-amplifier transistor 41 of an audio or voice frequency amplifier circuit 40.

It will be noted that the transistor 61 is so connected that it can operate for a negative half cycle of the audio input signal thereto. The emitter potential $V_{e1}$ of the transistor 61 is fixed to a potential level which is higher than the base potential $V_{b1}$ for the magnitude the voltage $V_{be1}$ across the base-emitter junction of the transistor 61. In other words, $V_{e1} = V_{b1} + V_{be1}$. The emitter potential $V_{e2}$ of the transistor 71 is selected to be lower than the base potential $V_{b2}$ for the magnitude of the voltage across the base-emitter path of the transistor 71. Accordingly, the emitter potential $V_{e2}$ of the transistor 71 is substantially equal to the base potential $V_{b1}$ of the transistor 61. Since the potential $V_{b1}$ is determined by the division ratio of the divider resistors 63 and 64, the potential $V_{b2}$ can be set at a desired level by correspondingly varying the above divider ratio. The transistors 61 and 71 and the diode 81 are provideable with 2SC458, 2SC458 and 1S2076 respectively, made by HITACHI, LTD.

With such circuit configuration, an audio or voice signal applied to the input terminal 10 is fed to the audio frequency amplifier circuit 40 through a capacitor 30 and appears at the audio output terminal 50 after having been amplified. A portion of the audio signal is supplied also to the input terminal 65 of the gain control circuit 678. The audio signal applied to the input terminal 65 is then fed to the base of the transistor 61 through the capacitor 62, which transistor will thereupon be biased forwardly for the negative half cycle of the input audio signal to become conductive and thus serve as a detector. When the transistor 61 is turned on, the capacitor 66 will discharge to the emitter in dependence upon the internal resistance of the transistor 61 which varies as a function of the magnitude or level of the input signal. As a consequence, the emitter potential $V_{e1}$ of the transistor 61 will be decreased in proportion to the level of the input signal with a time constant $T_1 = R_{61} \cdot C_{66}$, wherein $R_{61}$ is the internal resistance of the transistor 61 and $C_{66}$ is the capacity of the capacitor 66. In other words, so far as the input signal remains at a low level, the current flowing through the transistor 61 from the capacitor 66 to the ground is small because of a high internal resistance $R_{61}$ of the transistor 61 with a result that the emitter potential $V_{e1}$ is also slowly decreased. On the contrary, the emitter potential $V_{e1}$ will decrease rapidly when the input signal is at a high level, since the internal resistance $R_{61}$ is correspondingly lowered. The decrease in the emitter potential $V_{e1}$ of the transistor 61 involves a corresponding decrease in the base potential $V_{b2}$ of the transistor 71 at the succeeding stage, as accompanied with decrease in the emitter potential $V_{e2}$ (gain control potential) of the transistor 71. This results in the decrease of the base potential of the amplifier transistor 41 of the audio amplifier circuit 40. In this manner, the bias voltage of the audio amplifier transistor 41 is varied due to the variation in the emitter voltage $V_{e2}$ of the transistor 71, thereby to control the gain of the transistor 41.

When the emitter potential $V_{e1}$ of the transistor 61 is lowered, the diode 81 will become nonconductive. That is, the circuit parameters are so selected that the diode 81 will be turned off in response to a slight decrease in the emitter potential $V_{e2}$ of the transistor 71. When the diode 81 is in the non-conductive state, the capacitor 82 will discharge and the resulted current will flow through the resistor 83 of a high resistance value. In this way, the discharge of the capacitor 82 is effected slowly with a time constant $T_3' = C_{82} \cdot R_{83}$, wherein $C_{82}$ is the capacity of the capacitor 82 and $R_{83}$ is the resistance value of the resistor 83.

When a positive half cycle of the audio signal is fed to the base of the transistor 61, the latter is then turned off to terminate the detecting function. Then the current from the power source will flow to the capacitors 66 and 82 through the resistor 78 and the diode 81, respectively, whereby these capacitors 66 and 82 are charged to raise the emitter potential $V_{e1}$ of the transistor 61.

However, the period of the audio signal is generally short so that the application of the positive half cycle is rather instantaneous. Accordingly, the non-conductive period of the transistor 61 is very short and the transistor 61 will be soon turned on again for the next negative half cycle of the audio signal. The emitter potential $V_{e1}$ thereof is thus lowered again in the manner described above.

At this point, it is to be noted that in the above circuit arrangement, the restoring time duration of the emitter potential $V_{e1}$ of the transistor 61 is set to be greater than the control operation time duration, so that the rate of increase in the emitter potential $V_{e1}$ at the time of the non-conductive state of the transistor 61 is low as compared with the rate of decrease in the emitter potential $V_{el}$ in the conducting state of the transistor 61. Accordingly, the emitter potential $V_{el}$ may not be restored to the starting level before the application of the audio signal. The diode 81 will remain non-conductive and the capacitor 82 will continue to discharge.

In this manner, so long as the audio signal is supplied to the input terminal 10, the transistor will be repeatedly switched to the conductive and non-conductive states alternatively with the emitter potential $V_{el}$ being maintained at controlled (lowered) level, while the capacitor 82 will continue to discharge until the potential at the pole thereof connected to the diode 81 has been lowered to the potential at which the diode 81 becomes conductive.

When the supply of the audio signal to the input terminal 10 is interrupted or cut off, the transistor 61 is driven into a completely non-conductive state and the emitter potential $V_{el}$ thereof is at first restored to the level sufficient to enable the diode 81 to be conductive with a time constant $T_2 = R_{78} \cdot C_{66}$, wherein $R_{78}$ is the resistance value of the resistor 78. Since the cathode potential of the diode 81 is lowered due to the discharge of the capacitor 82, the diode 81 will become conductive before the emitter potential $V_{el}$ of the transistor 61 is restored to the starting potential level prevailing when no audio signal is supplied. The potential level at which the diode 81 is made conductive is varied in dependence on the discharge level of the capacitor 82. When the charge level at the capacitor 82 remains relatively high, the decrease in the cathode potential of the diode 81 is correspondingly small. Accordingly, for the conduction of the diode 81, the emitter potential $V_{el}$ of the transistor 61 has to be restored nearer to the starting level prevailing when the audio signal has not yet been received. On the contrary, when the potential level at the capacitor 82 is low due to a large amount of discharge thereof, the cathode potential of the diode 81 is correspondingly more lowered. In this case, the diode 81 will become soon conductive, when the emitter potential $V_{el}$ of the transistor 61 goes toward the level to be restored.

In this way, when the emitter potential $V_{el}$ of the transistor 61 is restored to the level at which the diode 81 becomes conductive, the capacitor 82 will stop discharging at this time point and thereafter begin to be charged with the current from the power source through the resistor 78 and the diode 81.

After the emitter potential $V_{el}$ of the transistor 61 has been restored to the level enabling the diode 81 to be conductive, then the emitter potential $V_{el}$ will be restored to the starting level prevailing before the reception of the audio signal with a different time constant $T_3$ which is equal to $R_{78}(C_{66} + C_{82})$.

In the above description, it is assumed that the resistors 78 and 83 are so selected that the relation $R_{78} < R_{83}$ is fulfilled. In practice, the resistance $R_{83}$ may be selected about twice as high as $R_{78}$. Further, the capacitors 66 and 82 are so designed that $C_{66} < < C_{82}$. For example, the capacitance $C_{82}$ of the capacitor 82 may be selected about fourteen times as high as the capacity $C_{66}$ of the capacitor 66.

Next, description will be made of the circuit operations by considering the relation between the input duration and the signal level of the audio signal applied to the input terminal 10 at the time when the input audio signal is at a low level.

In the case that the audio input signal is at a low level with the input duration thereof short, the emitter level $V_{el}$ of the transistor 61 is slowly controlled or lowered with the time constant $T_1 = R_{61} \cdot C_{66}$ in proportional dependence on the input signal level. However, restoration of the controlled emitter potential $V_{el}$ is rapidly effected with the time constant $T_2' \simeq R_{78} \cdot C_{66}$.

In more detail, under the conditions described above, the capacitor 82 will scarcely be discharged during the control operation since the resistor 83 is of a great resistance value, as will be easily appreciated from the description made hereinbefore. Accordingly, the charging of the capacitor 82 at the time of the restoration is so instantaneously completed that the time required for the charging may be neglected.

When the input duration is long, the capacitor 82 can discharge considerably through the resistor 83 in dependence on the length of the input signal duration. Consequently, in negligible much time will be required for charging the capacitor 82. As a result of that, the emitter potential $V_{el}$ of the transistor 61 is slowly restored with the time constant $T_3 = R_{78}(C_{66} + C_{82})$.

Description will now be made of the circuit operations with reference to the cases in which the input signal durations are differed for a given high level of the input audio signal.

When the input duration of the input audio signal is short, the emitter potential $V_{el}$ of the transistor 61 is speedily controlled or lowered in dependence on the input signal level which is assumed relatively high in this case. The restoration of the emitter potential $V_{el}$ is also effected rapidly as in the case of a low level input audio signal. However, since the emitter level $V_{el}$ of the transistor 61 is controlled or lowered sufficiently for a shorter time than that of the case of the low level signal, a slightly longer time is required for the restoration as compared with the case of the low level signal.

In case the input duration is relatively long, the restoration of the emitter potential $V_{el}$ is proceeded slowly in a similar manner as the case of the input signal of a low level. However, when compared with the latter case, the discharge of the capacitor 82 is relatively greater, requiring an appreciably increased charging time. Consequently, the restoration time will become slightly longer.

In summarization, it can be concluded that, when the audio input signal is of a low level and has a short input duration, the control of the potential for the gain control is effected slowly, while the restoration of the potential will take place rapidly. For a long input duration, the control as well as the restoration of the potential for the gain control will be carried out slowly.

When the input signal level is high and the input duration is short, the control and the restoration of the gain control potential will be speedily effected.

In this manner, due to the circuit arrangement such that the restoration of the gain control potential is rapidly conducted in case the audio input signal has a high level with a short input duration, the gain control operation can follow the input signal, whereby a low level signal succeeding to a preceding high level signal can be reproduced with a high reliability without involving any appreciable interruption in the voice signal which has been the case in the conventional gain control circuit.

Furthermore, since the restoration of the emitter potential $V_{el}$ of the transistor 619 is delayed as a function of the input duration of the audio signal, an effective gain control can be accomplished even for a high level input signal having a long input duration according to the invention.

Although the transistors 61 and 71 have been described as having PNP and NPN conduction types, respectively, it will be understood that the same effect can be obtained even if the conduction types of these transistors are reversed.

Figure 2:
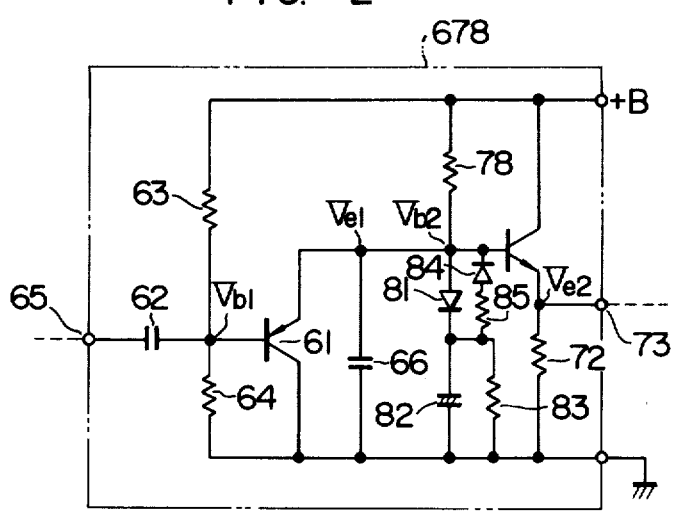
FIG. 2, 3, 4 and 5 show circuit arrangements of different embodiments of the gain control circuit according to the inventions.

FIG. 2 shows another embodiment of the invention. In this FIGURE, reference numeral 84 denotes a diode having a cathode connected to the anode of the diode 82 shown in FIG. 1 and anode connected to the cathode of the diode 82 through a resistor 85. For the diode 84, it is preferred to use a diode such as silicon diode or the like which permits a steeply rising voltage. The resistor 85 serves to adjust the rising voltage of the diode 84 and may be omitted, if unnecessary in practical applications. The remaining circuit arrangement of the gain control circuit shown in FIG. 2 is same as that of the circuit shown in FIG. 1. The circuit components common to these two embodiments are designated by the same reference numerals.

Referring to FIG. 2, when the diode 84 is so arranged that it may become conductive when the emitter level $V_{e1}$ is lowered below a predetermined level due to the application of the voice or audio signal to the input terminal 65, the electric charge at the capacitor 82 will then be sufficiently discharged toward the transistor 61 through the diode 84. As a result, the restoration of the emitter potential $V_{e1}$ of the transistor 61 will be correspondingly delayed. On other words, when the audio signal having so high level as to turn on the diode 84 is applied to the input terminal 65, the restoration of the emitter potential $V_{e1}$ will be effected slowly, even if the input duration of the applied audio signal is not appreciably long. In such case, a substantial quantity of electric charge stored in the capacitor 82 are discharged through the diode 84. The resistance value of the resistor 83 will then be of little significance.

By using other diode having a different rising voltage characteristic for the above described diode 84 or alternatively by varying the resistance value of the resistor 85 connected in series to the diode 84, it is possible to vary the restoring time as another function of the level and duration of the input signal.

Figure 3:
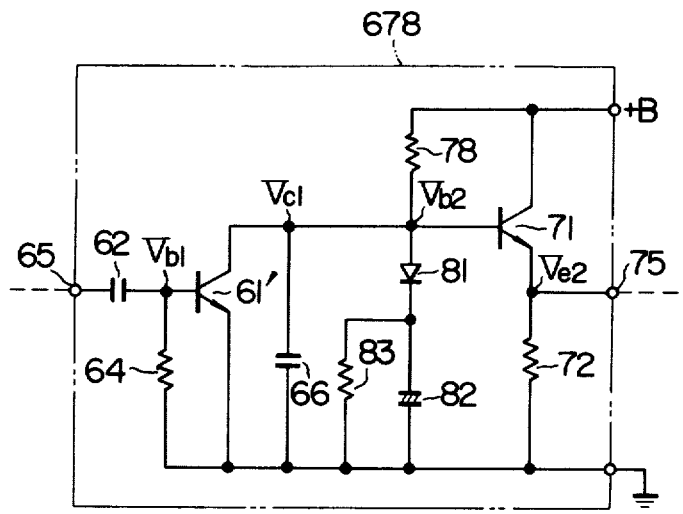

FIG. 3 shows still another embodiment of the invention. In this FIGURE, reference numeral 61' designates a detection transistor of NPN-type having a base connected to the input terminal 65 through the capacitor 62 and grounded through the resistor 64. The emitter of the transistor 61' is directly grounded, while the collector thereof is indirectly grounded through a capacitor 66 and connected to the base of the NPN-type transistor 71 which serves for the gain control. The remaining circuit configuration is same as that of FIG. 1 and accordingly detailed description thereof will be unnecessary. In the embodiment of FIG. 3, the transistor 71 is operated as an emitter-follower type amplifier having the base potential $V_{b2}$ determined by the divider resistor 78 and 83.

When the audio or voice signal is applied to the input terminal 65 of the above circuit, the signal is detected at the base-emitter junction of the transistor 61', whereby the collector thereof receives current from the charged capacitor 66. Since the capacitor 82 is isolated at that time from the collector of the transistor 61' by the diode 81, the discharging time constant provided by the transistor 61' is decreased. This is because the base current (or collector current) is decreased as accompanied with the increased ratio of discharge time interval, as the input signal is increased. Electric charge stored in the capacitor 82 of a large capacity is discharged through the resistor 83.

When current flows to the collector of the transistor 61', the collector potential $V_{c1}$ thereof and hence the base potential $V_{b1}$ of the transistor 71 are lowered, which is followed by the emitter potential $V_{e2}$ (gain control potential) of the transistor 71.

The control of the emitter potential $V_{e2}$ of the transistor 71 is performed with eference to the rising edge of the voltage $V_{be1}$ across the baseemitter junction of the transistor 61'. Accordingly, the above control will be more effective for a high level input signal. The controllingtime and the restoring time will depend on the amplitude (level) and the duration of the input signal.

More particularly, when the input signal of a small amplitude or at a low level is input for a short duration, the control for the gain control potential is effected slowly. However, the restoration of the potential will take place speedily. For a high input signal of a short duration, both of the control and the restoration are rapidly effected. For a low level input signal of a long duration, the slow control and restoration will take place. A high level input signal of a long duration will bring about a rapid control and a slow restoration. In this way, ideal operation can be accomplished.

Figure 4:
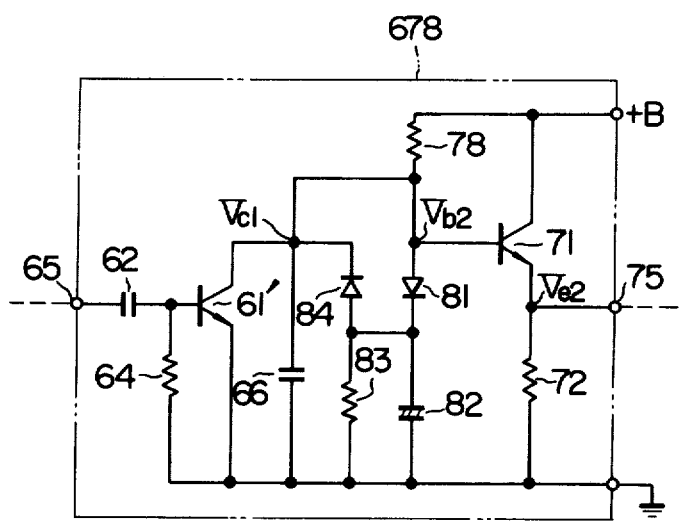

FIG. 4 shows still another embodiment of the invention. In FIG. 4, reference numeral 84 indicates a diode connected in anti-parallel with the diode 81. Except for the provision of the diode 84, the circuit arrangement of FIG. 4 is same as that of FIG. 3 and therefor further description will be unnecessary. Due to the above arrangement of the diode 84, the circuit shown in FIG. 4 provides advantageous effects as those accomplished by the circuit shown in FIG. 2.

Figure 5:
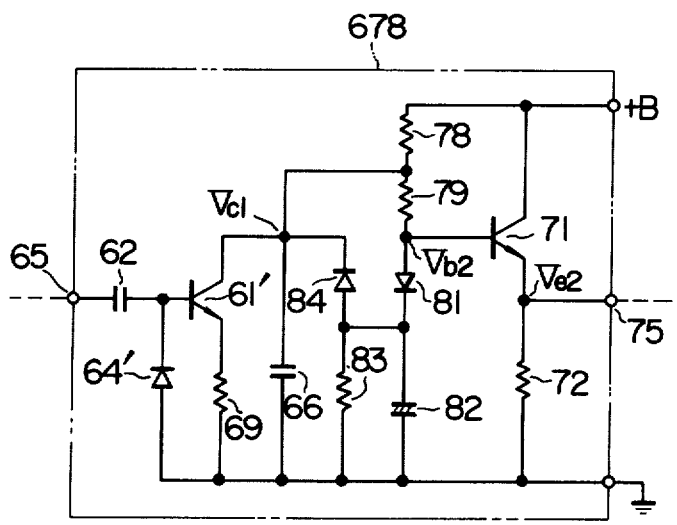

According to another embodiment shown in FIG. 5 in which a resistor 79 is added between the cathode of the diode 84 and the base of the transistor 71, the diode 84 is destined to become effective only for the input signal of an excessively high magnitude.

In the above described embodiments, the signal supplied to the input terminal 10 is subjected to the half-wave detection through the transistor 61 or 61'. However, a full-wave detection may be realized by providing a detection diode 64' across the base-emitter of the transistor 61 or 61', as shown in FIG. 5.

I claim:

1. A gain control circuit for an audio signal amplifier operatively amplifying audio signals supplied to an audio signal input terminal thereof and providing amplified audio signals at an audio signal output terminal thereof and further having a bias circuit for supplying bias voltage to said amplifier to control amplifying gain thereof, said gain control circuit comprising:
   a. a detection circuit supplied at an input terminal thereof with the audio signals for decreasing and increasing output impedance thereof in accordance with the increasing and decreasing of said audio signals, respectively;
   b. a first capacitor connected across said detection circuit so as to form a first discharging circuit therewith while said detection circuit is conductive;
   c. a power source and a first resistor connected in series with said first capacitor to form a first charging circuit therewith, so that said first capacitor is charged up by said power source through said first resistor while said detection circuit is not conductive;

d. a second capacitor and a second resistor connected in parallel to form a second discharging circuit, the time constant of said second discharging circuit being larger than that of said first discharging circuit;

e. a switching circuit connected in series with said second discharging circuit, said series connected switching circuit and said second discharging circuit being coupled across said detecting circuit, and being also connected in series to said power source through said first resistor to form a second charging circuit therewith, so that said second capacitor is charged up by said power source while said switching circuit is conductive; and f. a control circuit having input terminal supplied with output potential of said detection circuit and output terminal connected to said bias circuit, said control circuit providing at the output terminal thereof a control voltage the potential of which varies in dependence upon the potential supplied to the input terminal thereof thereby to correspondingly control the bias voltage of said bias circuit for controlling the gain of said amplifier.

2. A gain control circuit for an audio signal amplifier set forth in claim 1, wherein said detection circuit comprises a grounded collector transistor, the base of which is connected to an input terminal thereof and the emitter of which is connected to an output terminal thereof, and said switching circuit comprising a diode.

3. A gain control circuit for an audio signal amplifier set forth in claim 1, wherein said control circuit comprises an emitter follower transistor circuit, the base of which is connected to an output terminal thereof.

4. A gain control circuit for an audio-frequency amplifier apparatus which has an audio signal input terminal, an audio signal output terminal, an audio amplifier circuit for amplifying the audio signal supplied to said input terminal and feeding the amplified audio signal to said output terminal, and a basis circuit for supplying biasing voltage to said amplifier circuit to control the gain thereof, said gain control circuit comprising:

a. a detection circuit having an input terminal connected to said audio signal input terminal for deriving and detecting a portion of the audio signal supplied to said audio signal input terminal thereby to control potential at an output terminal of said detection circuit through the detected signal, b. a control circuit having an input terminal connected to said output terminal of said detection circuit and an output terminal connected to said bias circuit for said audio amplifier circuit, the potential of said output terminal of said control circuit being controlled in dependence on the potential at said output terminal of said detection circuit thereby to correspondingly control said biasing voltage of said bias circuit for the gain control of said audio amplifier circuit, c. a first capacitor connected to the connection between said output terminal of said detection circuit and the input terminal of said control circuit, said first capacitor comprising a portion of a first discharging circuit in cooperation with said detection circuit which controls the potential at said output terminal of said detection circuit in accordance with said audio input signal when said detection circuit is made conductive by said audio signal applied to said audio input terminal, d. a first resistor connected between an electric power source and said connection between the output terminal of said detection circuit and the input terminal of said control circuit and comprising a portion of a first charging circuit in cooperation with said first capacitor with said first resistor and said source arranged for charging said first capacitor and for restoring the potential at the output terminal of said detection circuit with a longer time duration than the discharging time duration of said first discharging circuit, when said detection circuit is nonconductive, e. a second discharging circuit comprising the parallel combination of a second capacitor and a second resistor coupled with said first discharging circuit for discharging with a larger time constant than that of said first discharging circuit during the detecting operation and for delaying the restoration of the potential at the output terminal of said detection circuit in accordance with the input time duration of said audio signal, f. a switching circuit connected between said second discharging circuit and the connection between the output terminal of said detection circuit and the input terminal of said controlling circuit, said switching circuit being nonconductive during the detecting operation of said detection circuit and the discharging operation of said second discharging circuit and being conductive when the detecting operation of said detection circuit has ceased and said first capacitor is charged thereby to be restored with a predetermined potential at the output terminal of said detection circuit, and g. said second charging circuit comprising said second capacitor, said switching circuit, said first resistor and said power source, for charging said second capacitor upon the cessation of the detecting operation and the conduction of said switching circuit, and for restoring the potential at the output terminal of said detection circuit in cooperation with said first charging circuit.

5. A gain control circuit for an audiofrequency amplifier apparatus as set forth in claim 4, wherein said switching circuit comprises a diode.

6. A gain control circuit for an audio-frequency amplifier apparatus as set forth in claim 3, wherein the anode of said diode constituting said switching circuit is connected to the junction of the output terminal of said detection circuit and the input terminal of said control circuit, while the cathode of said diode is connected to said second discharging circuit, whereby the stored charge in said second capacitor is prevented from being discharged to the output terminal of said detection circuit, when said detection circuit is operated.

7. A gain control circuit for an audio-frequency amplifier apparatus as set forth in claim 6, wherein said switching diode is connected with a second diode in an anti-parallel connection.

8. A gain control circuit for an audio-frequency amplifier apparatus as set forth in claim 7, wherein said second diode is connected in series with a third resistor and said series connection is connected in parallel with said switching diode.

9. A gain control circuit for an audio-frenquency amplifier apparatus which has an audio signal input terminal, an audio signal output terminal, an audio amplifier circuit for amplifying the audio signal supplied to said input terminal and feeding the amplified audio signal to said output terminal, and a bais circuit for supplying biasing voltage to said amplifier circuit to control the gain thereof, said gain control circuit comprising:

a. a detection transistor for detecting a portion of said audio signal applied to said audio signal input terminal and producing a potential at an output electrode thereof which is controlled by said detected signal, b. a gain control transistor having an input electrode connected to the output electrode of said detection transistor and an output electrode, the potentials of which are controlled in dependence upon said controlled potential as said output electrode of said detection transistor, the potential available at said output electrode of said gain control transistor is adapted to be utilized for controlling the biasing voltage of said bias circuit to thereby control the gain of said audio amplifier circuit, c. a first capacitor having a relatively small capacitance and connected to the connection between said output electrode of said detection transistor and the input electrode of said gain control transistor, said first capacitor comprising a portion of a first discharging circuit in cooperation with said detection transistor which controls the potential at said output electrode of said detection transistor in accordance with said audio input signal when said detection transistor is made conductive by said audio signal applied to said audio input terminal, d. a first resistor connected between an electric power source and said connection between the output electrode of said detection transistor and the input electrode of said gain control transistor in series with said first capacitor, and comprising a portion of a first charging circuit in cooperation with said first capacitor and said source for charging said first capacitor and for restoring the potential at the output electrode of said detection transistor with a longer time duration than the discharging time duration of said first discharging circuit, when said detection transistor is nonconductive, e. a second discharging circuit comprising the parallel circuit of a second capacitor having a comparatively small capacitance and a second resistor coupled with said first discharge circuit for discharging with a larger time constant than that of said first discharging circuit during the detecting operation and for delaying the restoration of the potential at the output terminal of said detection transistor in accordance with the input time duration of said audio signal, f. a switching diode connected between said second discharging circuit and the connection between the output electrode of said detection transistor and the input terminal of said controlling circuit, said switching diode being nonconductive during the detecting operation of said detection transistor and the discharging operation of said second discharging circuit and being conductive when the detecting operation of said detection transistor has ceased and said first capacitor is charged thereby to be restored with a predetermined potential at the output terminal of said detection transistor, and g. said second charging circuit comprising said second capacitor, said switching diode, said first resistor and said power source, for charging said second capacitor upon the cessation of the detecting operation and the conduction of said switching diode, and for restoring the potential at the output terminal of said detection transistor in cooperation with said first charging circuit.

10. A gain conrol circuit for an audio-frequency amplifier apparatus as set forth in claim 9, further comprising a second diode connected with a resistor for setting the rising voltage for said second diode, said series connection of said second diode and resistor being connected in anti-parallel with said switching diode.

11. A gain control circuit for an audio-frequency amplifier apparatus as set forth in claim 9, wherein said detection transistor and said gain control transistor are of opposite conduction types relative to each other.

12. A gain control circuit for an audio-frequency amplifier apparatus as set forth in claim 9, further comprising a third resistor connected between the first output electrode of said detection transistor and the input electrode of said gain control transistor.

13. A gain control circuit for an audio-frequency amplifier apparatus which have an audio signal input terminal, an audio signal output terminal, an audio amplifier circuit for amplifying the audio signal supplied to said input terminal and feeding the amplified audio signal to said output terminal, and a bias circuit for supplying biasing voltage to said amplifier circuit to control the gain thereof, said gain control circuit comprising;

a. a detection transistor having an input electrode connected to said audio signal input terminal and two output electrodes connected, respectively, to a current source side and the ground side, said detection transistor serving to detect a portion of said audio signal supplied to said audio signal input terminal and produce at the first output electrode of the current source side a potential controlled by said detected signal, b. a gain control transistor having an input electrode connected to said first output terminal of said detecting transistor and having two output electrodes connected, respectively, to said current source side and the ground side, said first grounded said output electrode being connected to said bias circuit for said audio amplifier circuit, wherein the potentials at said input electrode and said first output electrode being controlled in dependence upon the controlled potential at said first output electrode of said detection transistor, thereby to control said biasing voltage of said bias circuit through said potential at said first output electrode of said gain control transistor for the gain control of said audio signal amplifier circuit, c. a first time constant circuit comprising a first resistor connected between the junction of said first output electrode of said detection transistor and said input electrode of said gain control transistor and said current source, and a first capacitor connected between the above junction and the ground, d. a switching diode having one electrode connected to a junction between said first output electrode of said detection transistor and said input electrode of said gain control transistor, and e. a parallel connection of a second resistor and a second capacitor, said parallel connection constituting a second time constant circuit connected between the other electrode of said change-over or switching diode and the ground,
wherein said first time constant circuit controls the potential at said first output electrode of said detection transistor for a short duration when said audio signal is applied to said audio signal input terminal regardless of magnitude of said audio signal and restores rapidly the controlled potential said output electrode of said detection transistor to the starting potential when said application of audio signal is interrupted, while said second time constant circuit is operative to regulate the restoration of the first output electrode potential of said detection transistor in cooperation with said first time constant circuit so that the restoration of said emitter potential is rapidly effected when said audio signal has a short input duration, while the restoration is decelerated upon a long input duration of said applied audio signal, and said switching diode is so arranged that the discharging from said second time constant circuit toward said first output electrode of said detection transistor is inhibited.

14. A gain control circuit for an audio-frequency amplifier apparatus as set forth in claim 13, further comprising a second diode connected in series with a resistor for setting rising voltage of said second diode, said series connection of second diode and resistor being connected in anti-parallel with said switching diode.

15. A gain control circuit for an audio-frequency amplifier apparatus as set forth in claim 13, said detection and gain control transistors are of opposite conduction types relative to each other.

16. A gain control circuit for an audio-frequency amplifier apparatus as set forth in claim 13, further comprising a third resistor connected between said first output electrode of said detection transistor and said input electrode of said gain control transistor.

17. A gain control circuit for an audio frequency amplifier apparatus as set forthe in claim 4, wherein the time constant of said first discharging circuit is larger than that of said second discharging circuit, the time constant of said first charging circuit is larger than that of said second charging circuit, the time constant of said first discharge circuit is larger than that of said first charging circuit and the time constant of said second discharging circuit is larger than that of said second charging circuit.

18. A gain control circuit for an audio frequency amplifier apparatus as set forth in claim 9, wherein said switching diode is conductive during no signal and is nonconductive when the audio signal is applied to said detection transistor and the potential of said switching diode at the detection transistor side is reduced by the detecting operation of said detection transistor controlling the potential at the output electrode of said detection transistor.

* * * * *